(12) United States Patent
Hein et al.

(10) Patent No.: US 6,737,901 B2
(45) Date of Patent: May 18, 2004

(54) INTEGRABLE, CONTROLLABLE DELAY DEVICE, DELAY DEVICE IN A CONTROL LOOP, AND METHOD FOR DELAYING A CLOCK SIGNAL USING A DELAY DEVICE

(75) Inventors: Thomas Hein, München (DE); Patrick Heyne, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/266,295

(22) Filed: Oct. 8, 2002

(65) Prior Publication Data

US 2003/0085747 A1 May 8, 2003

(30) Foreign Application Priority Data

Oct. 8, 2001 (DE) .......................................... 101 49 585

(51) Int. Cl.[7] .............................................. H03H 11/26
(52) U.S. Cl. ....................... 327/270; 327/158; 327/272; 327/274
(58) Field of Search ................................ 327/269, 270, 327/285, 287, 271, 272, 274, 276, 277, 278, 280, 281, 284, 158, 149, 161

(56) References Cited

U.S. PATENT DOCUMENTS

| 4,789,996 | A | * | 12/1988 | Butcher ...................... 375/376 |
|---|---|---|---|---|
| 5,336,939 | A | | 8/1994 | Eitrheim et al. ............ 327/291 |
| 5,355,097 | A | * | 10/1994 | Scott et al. .................. 331/1 A |
| 5,359,232 | A | | 10/1994 | Eitrheim et al. ............ 327/116 |
| 5,465,076 | A | | 11/1995 | Yamauchi et al. .......... 331/179 |
| 6,329,854 | B1 | | 12/2001 | Lee et al. .................... 327/158 |
| 2001/0050585 | A1 | * | 12/2001 | Carr ........................... 327/277 |

FOREIGN PATENT DOCUMENTS

| DE | 693 27 612 T2 | 11/1993 |
|---|---|---|
| DE | 43 27 116 A1 | 3/1994 |
| DE | 199 12 967 A1 | 3/2000 |
| EP | 0 570 158 B1 | 11/1993 |

* cited by examiner

Primary Examiner—Terry D. Cunningham
Assistant Examiner—Quan Tra
(74) Attorney, Agent, or Firm—Laurence A. Greenberg; Werner H. Stemer; Ralph E. Locher (57) ABSTRACT

A delay device has multiplexers connected in series in a differential configuration. First connections of the multiplexers are connected to the output of an upstream multiplexer. Second inputs of the multiplexers are connected to the input connection to which the signal that is to be delayed can be supplied. A control signal controls the switch position of one of the multiplexers such that its output is connected to the input of the delay device. All the other multiplexers are in the other switch position. This results in the delay device producing a specific delay time. When used in a delay control loop, this results in a jitter-free output signal, even if the operating conditions are fluctuating.

14 Claims, 4 Drawing Sheets

INTEGRABLE, CONTROLLABLE DELAY DEVICE, DELAY DEVICE IN A CONTROL LOOP, AND METHOD FOR DELAYING A CLOCK SIGNAL USING A DELAY DEVICE

BACKGROUND OF THE INVENTION

Field of the Invention

The invention relates to an integrable, controllable delay device having an input connection for an input signal which is to be delayed, an output connection for a delayed output signal, and a control connection for a control signal which controls the delay time. The invention also relates to use of such an integrable, controllable delay device. Finally, the invention relates to a method in order to delay a clock signal, using such a delay device.

Such integrable, controllable delay devices are widely used for delaying a clock signal in integrated semiconductor circuits. One particular application of the delay device is in a delay control loop. Delay control loops are used in digital circuits in order to produce clock signals at a specific phase angle. By way of example, synchronously operated integrated semiconductor memories, which operate on the double data rate principle, so-called DDR SDRAMs (double data rate synchronous random access memories) use a delay control loop in order, taking account of internal signal delay times, to produce a clock signal on the output side, which produces data that is to be emitted, in synchronism with an input clock signal which is supplied to the integrated circuit at some other point.

A delay control loop compares the clock signal which is supplied to the input side of the delay unit with the delayed clock signal which is produced on the output side, and readjusts the delay as a function of the phase difference until the phase difference is regulated as closely as possible to zero. It is particularly important for the clock on the output side to be as stable as possible and to be free of jitter. For example, the clock on the output side is intended to be influenced as little as possible by fluctuations in the supply voltage, and its current delay time setting is intended to be independent of the drive to the delay unit.

One known delay device is in the form of a so-called tapped delay line. In this case, inverters are connected in series. The signal that is delayed along the delay line can be tapped off via signal paths which branch off from the delay line. The signal paths are coupled to a common node on the output side. These branching signal paths each contain a tristate inverter, which either passes on the signal which is to be delayed, or is switched to produce a high impedance. The output-side node has a high capacitance, which is proportional to the number of inverter stages in the delay line. The tristate inverters switch relatively slowly. Once the signal has been tapped off from the chain of inverters, it is also necessary to take account of the signal delay produced by the tristate inverter and any inverter which there may be downstream. Finally, an inverter in the delay line has to drive two input loads which are connected to it on the output side, namely the downstream inverter in the delay line, and the input of the tapping tristate inverter.

European patent EP 0 570 158 B1 (DE 693 27 612 T2) and U.S. Pat. Nos. 5,336,939 and 5,359,232 disclose a circuit for producing a stable clock signal on the basis of frequency multiplication. The circuit contains a delay stage with a variable delay time, wherein two multiplexers are connected in series. A signal is supplied firstly without any delay and secondly via delay elements as well, to the input sides of the multiplexers.

U.S. Pat. No. 6,329,854 B1 and the corresponding German patent application DE 199 12 967 A1 disclose a delay control loop with a delay path wherein multiplexers are provided, whose input connections can be connected to one another via flipflops. All the multiplexers are driven at the same time, either by an UP control signal or by a DOWN control signal.

U.S. Pat. No. 5,465,076 and the corresponding German patent application DE 43 27 116 A1 disclose a programmable delay line, wherein multiplexers are used to whose inputs an input signal can be supplied directly and, in addition, with a delay.

SUMMARY OF THE INVENTION

It is accordingly an object of the invention to provide an integrable and controllable delay unit, its utilization in a control loop, and a signal delay method, which overcome the above-mentioned disadvantages of the heretofore-known devices and methods of this general type and wherein the delay device has a delay time that can be set as exactly as possible, so that a largely stable, jitter-free output clock can be produced when this delay device is used in a delay control loop. In particular, the output clock is intended to be as independent as possible of manufacturing-dependent fluctuations in the component parameters, supply voltage fluctuations or temperature fluctuations.

With the foregoing and other objects in view there is provided, in accordance with the invention, an integrable, i.e., integratable, controllable delay device, comprising:

an input terminal for receiving an input signal to be delayed;
an output terminal for outputting an output signal delayed with respect to the input signal;
a control connection for receiving a control signal controlling a delay time;
a multiplicity of multiplexers each having a first input, a second input, and an output connection;
the multiplexers forming a series circuit with downstream multiplexers and upstream multiplexers in a signal flow direction, with the second connection of a respective downstream multiplexer connected to the output of a respective upstream multiplexer, and the first connection of each the multiplexer connected to the input; and
the second connection of one of the multiplexers being connected to reference potential, and the output of another of the multiplexers being coupled to the output terminal.

In other words, the objects are achieved by an integrable, controllable delay device which comprises an input connection for an input signal which is to be delayed, an output connection for a delayed output signal, a control connection for a control signal which controls the delay time; a large number of multiplexers each having a first and a second input connection and one output connection, with the multiplexers being connected in series by connecting the second connection of a downstream multiplexer to the output of an upstream multiplexer and by coupling the first connections of all the multiplexers to the input connection, with the second connection of one of the multiplexers being connected to a connection for a reference potential, and the output of another of the multiplexers being coupled to the output connection.

With the above and other objects in view there is also provided, in accordance with the invention, the above-outlined delay device in combination with a delay control loop. The delay device is connected in the delay control loop such that a delay time of the delay device is readjusted in dependence on a phase difference between a clock signal input to the delay device and an output signal carried at the output of the delay device.

With the above and other objects in view there is also provided, in accordance with the invention, a method for delaying a clock signal. The method comprises the following steps:

providing an integrable, controllable delay device according to the above summary;

inputting the clock signal to be delayed at the input terminal and providing a control signal formed with a number of bits at the control connection of the delay device;

setting a switch position of two series-connected multiplexers in dependence on the bits of the control signal such that a connection is established in each case for passing on the clock signal to be delayed between the first signal input and the output connection of the two multiplexers;

setting a switch position of all other multiplexers such that a signal connection is produced between the second input connection and the output connection thereof;

outputting a delayed clock signal at the output terminal of the multiplexer connected last in the series circuit;

defining a phase difference between a first signal derived from the clock signal to be delayed and a second signal derived from the delayed clock signal; and generating the control signal in dependence on the phase difference between the first and second signals.

In other words, the method comprises these steps: provision of the clock signal to be delayed at the input connection and provision of the control signal, which comprises a number of bits, at the control connection; setting of the switch position of two series-connected multiplexers as a function of the bits of the control signal such that a connection which passes on the clock signal which is to be delayed is in each case produced between its first signal input and its output connection; setting of the switch position of all the other multiplexers such that a signal connection is produced between their second input connection and their output connection; production of a delayed clock signal at an output connection of the multiplexer which is arranged last in the series circuit; and formation of a phase difference between a signal, from which the signal to be delayed is derived, and from a further signal, which is derived from the delayed clock signal; and production of the control signal as a function of the defined phase difference.

In the delay device according to the invention, multiplexers are provided in order to form the signal delay time that is applied to the signal which is to be delayed. One of the inputs and one output of all the multiplexers are connected in series with one another. The other input of the multiplexers is coupled jointly to a node, and is connected to that connection which produces the input signal which is to be delayed.

Depending on the required delay time, the input signal which is to be delayed is injected into the series circuit at one of the multiplexers. A different delay time is produced, depending on the number of effective multiplexer stages which the signal has to pass through before reaching the output. The output signal is tapped off at the output of the last multiplexer connected in the series circuit. One of the inputs of the first multiplexer in the series circuit is connected to a constant potential, preferably ground.

The configuration of the delay device with multiplexers has the advantage that the respective capacitive load, to be driven on the output side, of the multiplexers and of the output of the last multiplexer stage as well remains the same independently of the respective delay time setting. The variation which is formed as a function of the delay time setting occurs on the input side. Capacitive fluctuations resulting from this in the capacitive load on the input side can be compensated for by a suitably powerful driver which produces the input signal which is to be delayed. The delay unit according to the invention has the advantage that the signal which is to be delayed is not subject to any capacitive load fluctuation that is dependent on the delay time. This driver may be a conventional inverter, which switches more quickly than a tristate inverter in a tapped delay line. The output of a multiplexer is connected only to the input of a single further downstream multiplexer. Compared with a tapped delay line, the delay unit formed by a multiplexer switches more quickly than the corresponding unit in the tapped delay line.

The delay unit is preferably designed to process differential signals. This means that a complementary, inverted signal is processed at the same time as each signal. This compensates for the influence of supply voltage fluctuations of the delay time. Each of the multiplexers has a particularly advantageous circuitry configuration, which is suitable for processing differential signals. When this delay unit is used in a delay control loop, a relatively jitter-free output clock signal is produced, even in different operating conditions.

Each of the multiplexers expediently has four current paths, which are connected at one end to a current source and are coupled via this to a first pole of a supply voltage, for example ground. The other ends of the four current paths are coupled in pairs to respective resistance elements. The signal is injected differentially into the four current paths. In order to obtain even better independence from fluctuations in the supply voltage, a capacitance is connected in parallel with the current source in order to compensate for and damp out corresponding fluctuations resulting from switching operations on currents between the four current branches. The resistance elements are preferably in the form of transistors connected as diodes, preferably so-called MOS diodes. The diodes are connected to the second pole of the supply voltage. In consequence, the current branches are also largely decoupled from the second pole of the supply voltage. It is even more advantageous for an MOS transistor, which is connected as a current source, to be connected in parallel with the diode. The control connection of this transistor is driven by a constant potential. The parallel circuit formed from the MOS diode and MOS current source may be referred to as an active resistance or linearized transistor.

In detail, the current paths each contain two MOS transistors, whose controlled paths are connected in series. One of the switches in the first and second current paths is in each case controlled jointly by a line of the control signal which sets the delay time. The comparable transistors in the third and fourth current paths are switched jointly by the complementary signal component of the control signal. The other transistors in the first and second current paths are connected to the complementary signal outputs of a multiplexer which is connected upstream in the chain of delay elements. The other transistors in the third and fourth current paths are driven by the complementary signal parts of the input signal, that is to say by the common input connection. Those ends of the current paths which are connected to the active resistance are connected to one another crossed over. The first and third current paths are connected to one active resistance, and the second and fourth current paths are connected to the other active resistances.

Depending on the delay time to be set, one of the multiplexers is set such that its output is connected to its first of the two input connections. The clock signal which is to be delayed is injected into the chain of series-connected multiplexers at this point. All the other multiplexers, both those upstream and those downstream, are set such that their output produces a signal connection to their respective second input.

In one particularly advantageous refinement of the setting of the delay device, two of the multiplexers are set such that their output is connected to their respective first input in order to form a signal connection. These multiplexers are expediently connected directly in series, that is to say the output of the first of these two series-connected multiplexers is connected directly—without the interposition of a further multiplexer—to the second input connection of the downstream one of these multiplexers. In this case, the clock signal which is to be delayed is injected, as before, into the multiplexer chain at the second of the directly series-connected multiplexers, in order to produce the delay. The clock signal which is to be delayed is at the same time also available on the output side of the first of the two directly series-connected multiplexers. However, it is not yet passed on by the second of the multiplexers. The second of the multiplexers is switched only if the delay time is to be increased by one step element, wherein case the clock signal which is to be delayed and is already present at its second input can be passed on directly to its output. The signal form of the output signal from the delay device is improved. In particular, no disturbance pulses, so-called glitches, are produced.

The multiplexers which are connected upstream in the multiplexer chain of the multiplexers considered above, which are connected directly in series, are expediently switched off in order to save power. This is particularly advantageous in the embodiment, specified above, of the multiplexers as current switches comprising at least four current paths and a current source.

Other features which are considered as characteristic for the invention are set forth in the appended claims.

Although the invention is illustrated and described herein as embodied in an integrable, controllable delay device, use of a delay device, and a method for delaying a clock signal using a delay device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
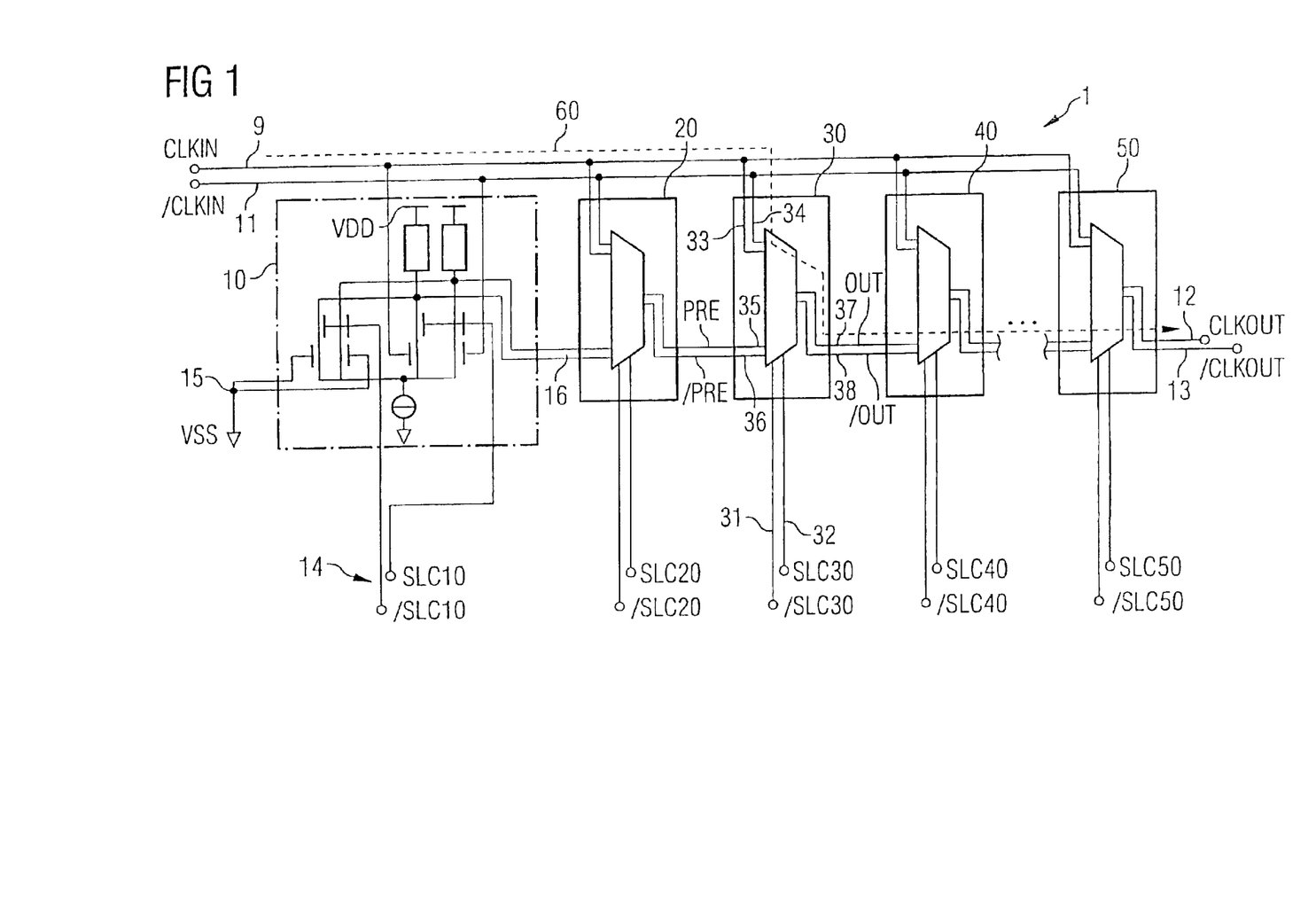
FIG. 1 is a schematic block diagram of a delay unit according to the invention.
Figure 3:
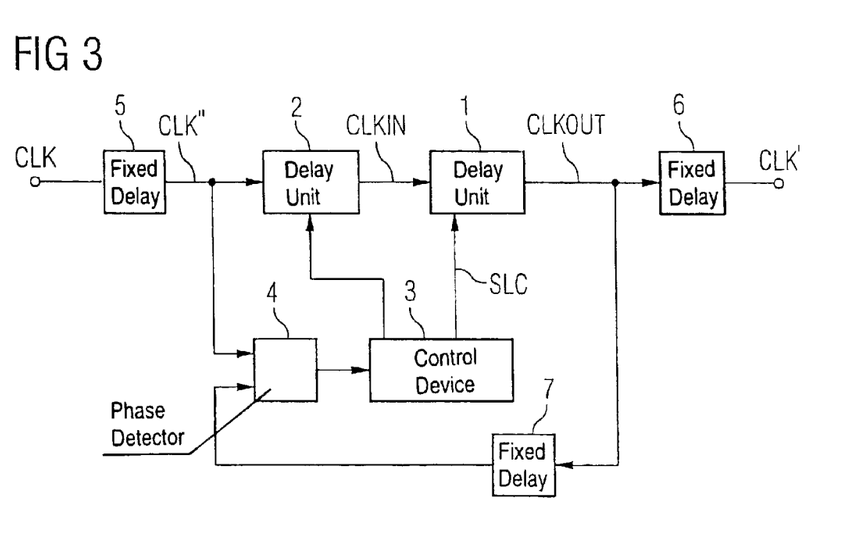
FIG. 3 is a block diagram of a delay control loop.

Referring now to the figures of the drawing in detail and first, particularly, to FIG. 1 thereof, there is shown the circuit of a delay unit 1, which can advantageously be used in the delay control loop illustrated in FIG. 3. The input clock signal CLKIN is thereby supplied as a differential signal, which comprises mutually complementary signal components CLKIN and /CLKIN. The delay-unit 1 is supplied at inputs 9, 11 with an input clock signal CLK that is to be delayed, and with the mutually complementary input clock signal /CLKIN. On the output side, a delayed output clock signal, which is once again differential, with the in-phase component CLKOUT and with the antiphase component /CLKOUT can be tapped off at connections 12, 13. The delay time between the input clock signal and the output clock signal is controlled as a function of a signal SLC. The signal SLC has a large number of bits, SLC10, SLC20, etc., which each comprise a normal component and a complementary component and are supplied at a connection 14 which has a large number of bit lines.

All of the signal processing in the delay unit 1 is thus carried out differentially. The voltage change at the inputs and outputs of a delay stage 10 is limited. The signals SLC, /SLC are full-level signals, and are thus virtually static.

The delay unit has a large number of series-connected multiplexers, of which, by way of example, the multiplexers 10, 20, 30, 40, 50 are shown. All the multiplexers have the same internal construction. By way of example, the multiplexer 30 will also be explained in detail in conjunction with the detailed implementation in FIG. 2. A first signal input 33, 34, which in each case carries differential signals, of the multiplexer 30 is coupled in the same way as all the other comparable inputs of the other multiplexers to the connections 9, 11 for supplying the differential input signal CLKIN, /CLKIN. The second differential input 35, 36 of the multiplexer is connected to the differential output of the upstream multiplexer 20. The differential outputs 37, 38 are connected in a corresponding manner to the second input of the downstream multiplexer 40. The corresponding bit of the control signal SLC30, /SLC30 is supplied in differential form to the differential control connections 31, 32.

The output of the last multiplexer 50 arranged in the series circuit is connected to the outputs 12, 13 of the delay unit 1. The second input of the first multiplexer 10 arranged in the series circuit of the multiplexers is connected to ground potential VSS.

The magnitude of the delay time which is produced between the differential inputs 9, 11 and the differential outputs 12, 13 for the differential input clock signal CLKIN, /CLKIN is supplied is governed by the number of multiplexers which the clock signal passes through between the input and output of the delay unit 1. In the illustrated case, the input clock signal CLKIN, /CLKIN is supplied to the multiplexer 30 and passes through all the downstream multiplexers 40, 50. The signal path is indicated by dashed lines, and is annotated 60. To do this, all the multiplexers upstream of the multiplexer 30, that is to say the multiplexers 10, 20, are set such that the signal path which is selected in the respective multiplexer connects the respective output to the second input, that is to say to the input shown at the bottom in the drawing. The downstream multiplexers 40, 50 have the same switch settings, so that they pass on the signal, which is supplied to them at the second input, that is to say at the input shown at the bottom, to their output. Only the multiplexer 30 has a different signal path setting, with the outputs 37, 38 being connected to the first differential input 33, 34. The input clock signal CLKIN is thus supplied to the multiplexer 30 at the first input, and passes through all the downstream multiplexers 40, 50 in order to reach the differential output 12, 13, as is shown by the signal path 60 in the form of a dashed line in FIG. 1.

This circuit has the advantage that the input 9, 11 always has the same capacitive load, largely irrespective of the switching state. Any capacitance variations can be compensated for by means of an appropriately large driver driving the input 9, 11. The output 12, 13 likewise provides the same driver power for downstream circuits.

The switch settings of each of the multiplexers are governed by corresponding bits in the control signal SLC. Each of the bits are supplied as complementary signals to the multiplexers.

Figure 2:
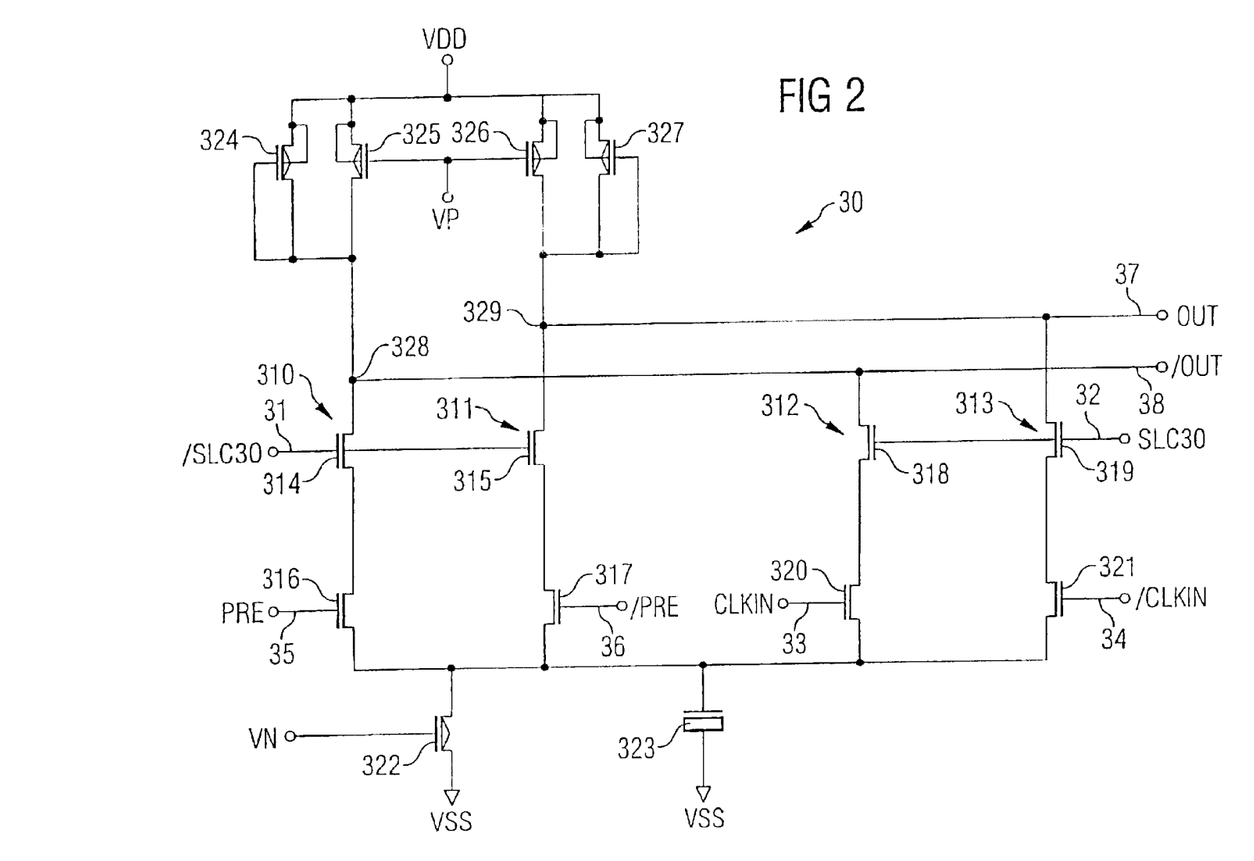
FIG. 2 is a detailed circuit diagram at transistor level of a multiplexer that is suitable for use in the delay device shown in FIG. 1.

It is particularly advantageous for all of the multiplexers 10, . . . , 50 to be designed as shown in detail in FIG. 2. The multiplexer 30 which is illustrated by way of example there has 4 current paths 310, 311, 312, 313. These are jointly connected to one current source 322 at the ground end of the current paths. The current source 322 connects the current paths to ground potential VSS. Each of the current paths has two n-channel MOS transistors, whose drain-source paths are connected in series. Those transistors 316, 317 in the first and second current paths 310, 311 which are on the current source side are driven differentially by the output signal PRE, /PRE from the preceding multiplexer. The gate connections of these transistors 316, 317 form the second, differential input of the multiplexer. The other transistors 314, 315 in the first and second current paths 310, 311 are driven by the complementary signal element /SLC30 of the control signal SLC which sets the delay time. In the third and fourth current paths, the transistors 320, 321 on the current source side are driven differentially by the clock signal CLKIN, /CLKIN is supplied on the input side. The other transistors 318, 319 in the third and fourth current paths 312, 313 are driven by the in-phase component SLC30 of the control signal SLC which sets the delay time. The current paths 310, 312 as well as 311, 313 are each coupled in pairs on the supply potential side. The coupling nodes 320 and 329, respectively, are connected via respective active resistances to the other pole VDD of the supply voltage. The nodes 328, 329 at the same time form the complementary outputs of the multiplexer 30.

In order to compensate for fluctuations during switching of the current, which is supplied from the current source 322, between the four current paths 310, 311, 312, 313, a capacitance 323 formed by an MOS transistor is connected in parallel with the current source 322. The capacitance 323 connects the common node to ground potential VSS.

The active resistance which connects the node 328 to the supply potential VDD is a p-channel MOS transistor 325 connected as a current source. The gate connection of the transistor 325 is connected to a constant potential VP. A transistor 324 connected as an MOS diode is connected in parallel with the drain-source path of the transistor 325. The gate connection of the transistor 324 is connected to the node 328 in order to form the MOS diode function. The active resistance which is connected to the node 329 comprises, connected in an appropriate manner, the p-channel MOS transistors 326, 327, whose parameters can be controlled better during production than resistive resistances. The active resistances mean that the potential difference between 328, 329 is as independent as possible of fluctuations in the supply voltage VDD, VSS. The active resistances could in principle also be replaced by resistive resistances.

Figure 4:
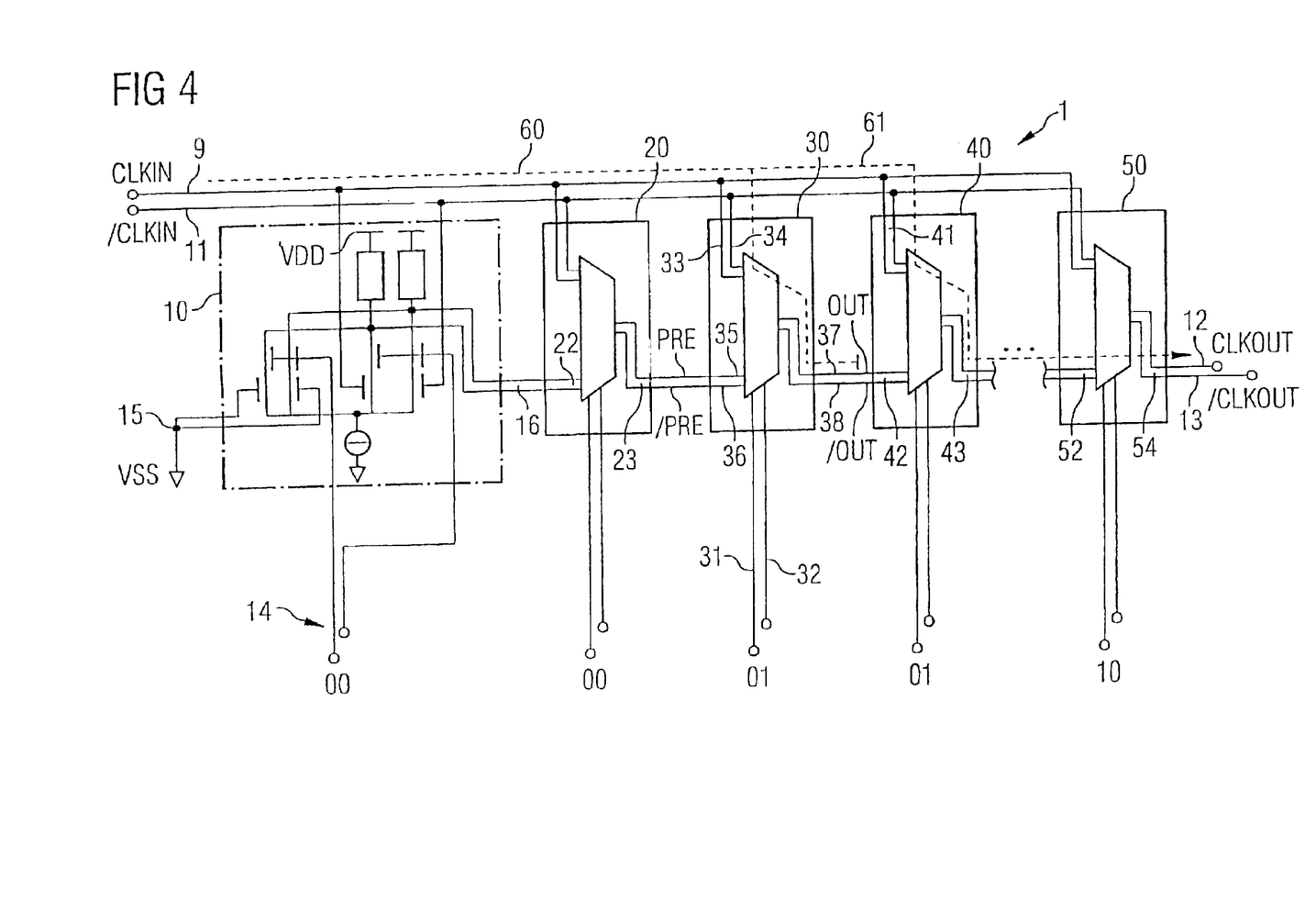
FIG. 4 is a schematic block diagram of a delay unit according to the invention with an advantageous operating setting.

In contrast to FIG. 1, the first inputs 33, 34 and 41 of the two multiplexers 30, 40, which are connected directly in series, in FIG. 4 are connected to the input connections 9, 11 for supplying the clock signal CLKIN, /CLKIN that is to be delayed. The clock signal CLKIN, /CLKIN is fed into the delay line at the multiplexer 40 and is passed along the signal profile 61. The multiplexer 30 admittedly passes on the clock signal CLKIN, /CLKIN to its output 37, 38. However, it is blocked there and is not passed on from the input connection 42 of the multiplexer 40, since its output 43 is connected to its first input 41 in order to form a signal path, and is not connected to its second input 42.

The described settings of the multiplexers 30, 40 result in the clock signal CLKIN, /CLKIN that is to be delayed being produced at this stage at the output 37, 38 of the multiplexer 30. If the delay to be produced by the delay device 1 is now intended to be increased by one delay time increment, wherein case the signal introduction into the delay line must be moved forward from the multiplexer 40 to the multiplexer 30, then the multiplexer 40 switches so that its output 43 is now connected to its input 42 in order to form a signal path. The clock signal CLKIN, /CLKIN is already present at the output 42 as a result of the previous setting described above, and can be passed on immediately to the output 43 of the multiplexer 40. Any uncontrolled signal state within the multiplexer 40 wherein disturbance pulses or glitches might possibly occur is avoided. The clock signal CLKOUT, /CLKOUT on the output side is thus free of disturbance signals even during switching processes for resetting the delay time.

In the operating state shown in FIG. 1, the second input connection 15 of the first multiplexer 10 is connected to ground VSS. Both of the corresponding switching transistors, for example the transistors 316, 317 in FIG. 2, are connected to ground VSS. The output 16 of the multiplexer 10 is thus drawn to the high level VDD. The second input of the downstream multiplexer 20 is driven by this high level. The level on the output side of the multiplexers is set approximately in the center of the level shift range between a high level and a low level which may be produced at the multiplexer outputs, since the current on the foot-point side is split half-and-half between the two current paths 310 and 311. The constant foot-point current flows through the multiplexers, even though they make no contribution to forming the delay time.

Provision is thus made in FIG. 4 to switch off the multiplexers 10, 20 that are upstream of the multiplexers 30, 40. This is achieved by setting the control signal /SLC10, SLC10, /SLC20, SLC20, which controls the switch settings of the multiplexers 10, 20, to a low level or to a logic "0", at the appropriate inputs. In consequence, all the current paths within the multiplexers 10, 20 are switched off. This reduces the power losses in the delay device 1, without reducing its functionality.

In the differential embodiment of the multiplexers 10, . . . , 50 of the delay device 1 as shown in FIG. 4, the following control signals can be applied to the control inputs which control the settings of the respective multiplexers: those multiplexers which pass on the clock signal CLKIN, /CLKIN at their respective ouput, that is to say the multiplexers 30, 40 in FIG. 4, are each controlled by complementary bits "01" at their control signal connections. In consequence, their output is connected to their respective first input. The multiplexers downstream from these two multiplexers, for example the multiplexer 50, are driven by the mutually complementary signal state "10". In consequence, their output 54 is connected to their respective second input 52. The multiplexers which are connected upstream of the multiplexers 30, 40, for example the multiplexers 10, 20, are themselves also each driven by the same signal combination "00". In consequence, all the current paths in these two multiplexers 10, 20 are switched off.

In the delay control loop illustrated in FIG. 3, the object is to convert the clock signal CLK supplied on the input side to a clock signal CLK' which can be tapped off on the output side and has a fixed controlled phase shift with respect to the clock signal CLK. The central element in the delay control loop is the delay path. The delay path comprises a first delay unit 2 and a second delay unit 1, which is connected downstream from it and is designed in a manner corresponding to FIG. 1. The first delay unit 2 produces a short delay, and is used for fine adjustment of the total delay time. The downstream delay unit 1 produces a greater delay, and is used for coarse setting of the total delay time between the signals CLK", CLKOUT.

A phase detector 4 determines the phase difference between the clock signal CLK" which is supplied to the input side of the delay line chain 2, 1 and the clock signal CLKOUT which is tapped off on the output side of the delay line chain 2, 1. If necessary, a circuit block with a fixed delay time 7 is connected in the feedback path. Depending on the phase difference, a control device 3 produces a control signal SLC, which provides one bit with complementary signal components for each of the multiplexers 10, . . . , 50 in the delay device 1. As explained in conjunction with FIG. 1, a maximum of only one bit is set during operation of the circuit, such that one multiplexer passes on the signal, which is applied to its first input connection, to its output. All the other multiplexers are set to precisely the complementary switching state. Apart from this, all the circuit blocks 5, 6, 7 have a constant delay time.

The phase locked loop shown in FIG. 3 has a very linear control range by virtue of the use of the delay device as illustrated in FIG. 1. The output signal is produced without any jitter, to be precise independently of temperature, parameter fluctuations of the components as a result of tolerances in the manufacturing process, supply voltage fluctuations, or the magnitude of the delay time set at any given time. The delay control loop with the illustrated architecture can cover a wide control range, up to very high clock frequencies.

We claim:

1. An integrable, controllable delay device, comprising:
   an input terminal for receiving an input signal to be delayed;
   an output terminal for outputting an output signal delayed with respect to the input signal;
   a control connection for receiving a control signal controlling a delay time;
   a multiplicity of multiplexers each having a first input, a second input, and an output connection;
   said multiplexers forming a series circuit with downstream multiplexers and upstream multiplexers in a signal flow direction, with said second input of a respective downstream multiplexer connected to said output of a respective upstream multiplexer, and said first input of each said multiplexer connected to said input;
   said second connection of one of said multiplexers being connected to reference potential, and said output of another of said multiplexers being coupled to said output terminal;
   one of said multiplexers including:
      first, second, third, and fourth current paths each containing a switch connected to one of said inputs of said multiplexer, and each containing a switch connected to a bit line of said control connection,
      a current source connected to said current paths, and
      a plurality of resistance elements, each one of said current paths connected to one of said resistance elements.

2. The delay device according to claim 1, wherein said one multiplexer with said second input connected to the reference potential is connected first in said series circuit, and said other multiplexer with said output connected to said output connection is connected last in said series circuit.

3. The delay device according to claim 1, wherein said control connection has a plurality of control bits, and wherein one of the control bits can in each case be supplied to one of said multiplexers for driving a switching state thereof.

4. The delay device according to claim 1, wherein one of said switches in said first and second current paths is in each case commonly connected to a signal line carrying a signal bit for the control signal, and another of said switches in said first and second current paths is in each case connected to signal lines carrying mutually complementary signals of said second input of said multiplexer.

5. The delay device according to claim 4, wherein one of said switches in said third and fourth current paths is in each case commonly connected to a further signal line carrying a complementary signal bit for the control signal, and another of said switches in said third and fourth signal paths is in each case connected to signal lines carrying mutually complementary signals of said first input of said multiplexer.

6. The delay device according to claim 1, wherein:
   each one of said resistance elements includes at least two transistors; and
   each one of said at least two transistors is connected as a diode.

7. The delay device according to claim 6, wherein said at least two transistors includes a first transistor having a controlled path connected between supply potential and respective said current paths, and said first transistor further has a control connection coupled to one of said current paths, and said at least two transistors includes a further transistor having a controlled path in each case connected in parallel with said controlled path of said first transistor, and a control connection coupled to a connection for a constant potential.

8. The delay device according to claim 1, wherein each one of said resistance elements includes a first transistor having a controlled path connected between supply potential and a respective said current path and having a control connection coupled to one of said current paths, and each one of said resistance elements includes a further transistor having a controlled path connected in parallel with said controlled path of said first transistor and a control connection coupled to a connection for a constant potential.

9. The delay device according to claim 1, wherein terminals of said current paths that are connected to said current source are coupled to a capacitor.

10. The delay device according to claim 9, wherein said current source and said capacitor are connected to a further supply potential, and said capacitor is connected in parallel with said current source.

11. In a delay control loop, the delay device according to claim 1 connected in the delay control loop such that a delay time of the delay device is readjusted in dependence on a phase difference between a clock signal input to the delay device and an output signal carried at said output of the delay device.

12. A method for delaying a clock signal, which comprises the following steps:
   providing an integrable, controllable delay device according to claim 1;
   inputting the clock signal to be delayed at the input terminal and providing a control signal formed with a number of bits at the control connection of the delay device;

setting a switch position of two series-connected multiplexers in dependence on the bits of the control signal such that a connection is established in each case for passing on the clock signal to be delayed between the first signal input and the output connection of the two multiplexers;

setting a switch position of all other multiplexers such that a signal connection is produced between the second input connection and the output connection thereof;

outputting a delayed clock signal at the output terminal of the multiplexer connected last in the series circuit;

defining a phase difference between a first signal derived from the clock signal to be delayed and a second signal derived from the delayed clock signal;

generating the control signal in dependence on the phase difference between the first and second signals; and saving power by switching off two multiplexers connected upstream of the two series-connected multiplexers.

13. The method according to claim 12, which comprises, during the step of setting the switch position of the two series-connected multiplexers, driving at least two multiplexers that are connected in series directly without an interposition of any further multiplexer, with the bits of the control signal, and connecting an output connection of an upstream one of the at least two multiplexers to the second input of a downstream multiplexer.

14. The method according to claim 12, wherein the multiplexers are configured for processing bits of a differentially supplied control signal, and the method comprises driving each of the upstream multiplexers by an identical first value of the control signal, driving the at least two series-connected multiplexers by two different bits, and driving downstream multiplexers in each case with two bits of the control signal that are complementary to the different bits.

* * * * *